United States Patent
Weber et al.

Patent Number: 5,470,662
Date of Patent: Nov. 28, 1995

[54] RECORDING FILMS WITH A HIGH REFRACTIVE INDEX MODULATION

[75] Inventors: Andrew M. Weber; Aleksander Beresniewicz, both of Wilmington, Del.

[73] Assignee: E. I. Du Pont de Nemours and Company, Wilmington, Del.

[21] Appl. No.: 328,935

[22] Filed: Oct. 25, 1994

Related U.S. Application Data

[63] Continuation of Ser. No. 146,816, Nov. 4, 1993, abandoned.

[51] Int. Cl.$^6$ .......................... B32B 17/10; B32B 27/08; B32B 27/30; G03C 1/675

[52] U.S. Cl. .................. 428/421; 428/442; 428/516; 428/520; 430/1; 430/2; 430/271; 430/281; 430/290; 430/907; 430/909; 430/916

[58] Field of Search .................... 428/483, 421, 428/422, 441, 442, 516, 520, 36.7; 526/206, 201, 202, 242, 249, 250; 430/1, 2, 281, 286, 290, 271, 907, 909, 916

[56] References Cited

U.S. PATENT DOCUMENTS

| | | | |
|---|---|---|---|
| 4,584,343 | 4/1986 | Lohr et al. | 525/60 |
| 4,585,306 | 4/1986 | Ohmori et al. | 350/96.34 |
| 4,639,069 | 1/1987 | Yatabe et al. | 350/1.7 |
| 4,963,471 | 10/1990 | Trout et al. | 430/282 |
| 4,965,152 | 10/1990 | Keys et al. | 430/1 |
| 5,098,176 | 3/1992 | Wolf | 359/11 |
| 5,138,469 | 10/1992 | Wood et al. | 359/3 |
| 5,151,331 | 11/1992 | Beeson et al. | 428/475.5 |
| 5,173,556 | 12/1992 | Mares et al. | 526/255 |
| 5,194,543 | 3/1993 | Schlipf et al. | 526/255 |

FOREIGN PATENT DOCUMENTS

| | | | |
|---|---|---|---|
| 61-243850 | 10/1986 | Japan | C08L 27/12 |
| WO89/04847 | 6/1989 | WIPO | C08F 214/18 |

*Primary Examiner*—Paul J. Thibodeau
*Assistant Examiner*—Vivian Chen

[57] ABSTRACT

Holographic films contain a copolymer binder having the following formula:

$$(M)_w(VAc)_x(VOH)_y(CTFE)_z$$

wherein M is a fluoromonomer; VAc is vinyl acetate; VOH is vinyl alcohol; and CTFE is chlorotrifluoroethylene; and wherein w, x, y, and z are percentages by weight; w is 5 to 22%, x is 50 to 75%, y is 3 to 8%, and z is 15 to 30% with the copolymer containing 3–35% by weight fluorine. These imaged films are particularly suited for lamination to glass in head-up display applications.

13 Claims, 1 Drawing Sheet

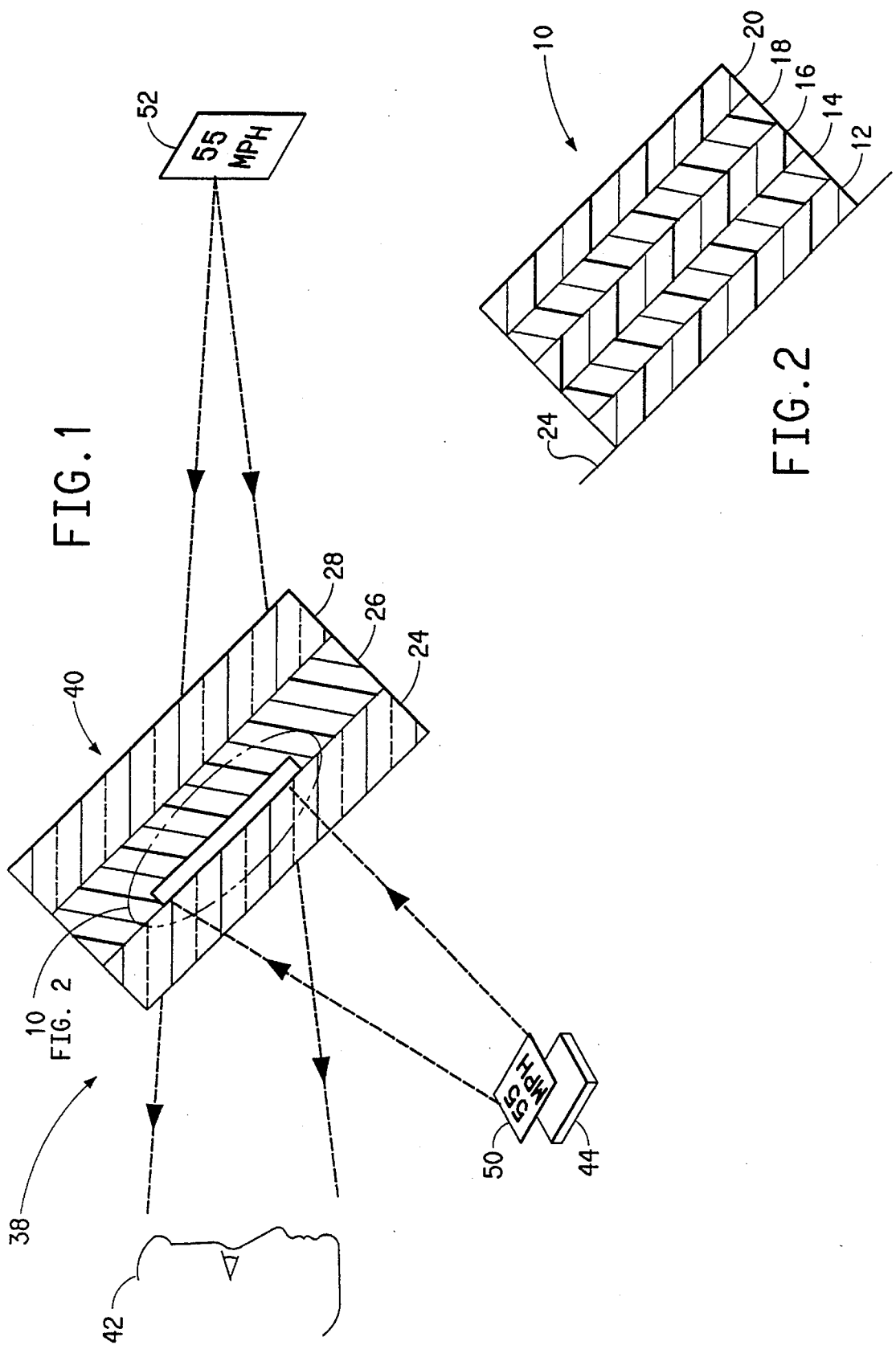

RECORDING FILMS WITH A HIGH REFRACTIVE INDEX MODULATION

This is a continuation of application Ser. No. 08/146,816 filed Nov. 4, 1993, now abandoned.

FIELD OF THE INVENTION

This invention relates to refractive index imaging and, more particularly, to photopolymerizable compositions and elements for recording refractive index images (e.g., holograms) in which the binder contains a copolymer of a fluoromonomer, vinyl acetate, vinyl alcohol, and a chlorofluoromonomer.

BACKGROUND OF THE INVENTION

Holographic recording films containing fluorinated binders are disclosed in U.S. Pat. No. 4,963,471 to Trout. In preferred compositions, the binder is a copolymer of tetrafluoroethylene and/or hexafluoropropylene with vinyl acetate. Photopolymerizable compositions employing these binders can be imaged to produce reflection holograms with refractive index modulation values greater than 0.040.

The compositions disclosed by Trout have numerous properties suitable for the preparation of head-up displays. However, the disclosed compositions do not provide the desired adhesion to adjacent layers, and high clarity (i.e., lack of haze), required for a commercial head-up display optical combiner. Thus, a need exists for specific compositions that not only provide advantages taught by Trout, but also provide the desired properties of good adhesion and high clarity for use in holography, and particularly for use in constructing single, full color holographic films used in applications such as optical combiners in head-up displays.

SUMMARY OF THE INVENTION

In one embodiment, the invention provides an improved photopolymerizable film composition containing a binder, a monomer, and a photoinitiator, adapted for the preparation of refractive index images, wherein the binder is a copolymer comprising the formula:

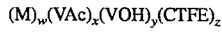

wherein M is a fluoromonomer, VAc is vinyl acetate, VOH is vinyl alcohol, CTFE is a chlorofluoromonomer; w, x, y and z are weight percents and w is greater than 0% to about 25%, x is about 40 to 90%, y is about 2 to 15%, and z is about 5 to 40%; with the proviso that said polymer contains about 3 to 35% fluorine by weight.

In a preferred embodiment w is 5 to 22%, x is 50 to 75%, y is 3 to 8%, and z is 15 to 30%. M is preferably tetrafluoroethylene and/or hexafluoropropylene.

In another embodiment, this invention provides a reflection hologram prepared from this composition. In still another embodiment, this invention provides an optical combiner comprising a reflection hologram prepared from this composition. In yet another embodiment, this invention provides a laminated structure, such as a windshield, containing the optical combiner mounted between two rigid, transparent plies bonded together with a suitable polymeric adhesive, such as polyvinyl butyral. The rigid transparent plies typically are glass.

BRIEF DESCRIPTION OF THE DRAWINGS

FIG. 1 illustrates a head-up display system having an optical combiner.

FIG. 2 illustrates a preferred structure for an optical combiner.

DETAILED DESCRIPTION OF THE INVENTION

PHOTOPOLYMERIZABLE COMPOSITION

The photopolymerizable composition contains a fluorine and chlorine containing organic polymeric binder(s), an addition polymerizable ethylenically unsaturated monomer, and an initiator system capable of being activated by actinic radiation. Other components conventionally added to photopolymerizable compositions may be present to modify the properties of the composition as will be appreciated by those skilled in the art. A useful discussion of the components of photopolymerizable compositions is found in "Photopolymers: Radiation Curable Imaging Systems", by B. M. Monroe, in *Radiation Curing: Science and Technology*, S. P. Pappas, Ed., Plenum, New York, 1992, pp. 399–440.

BINDER

Binders containing fluorine, chlorine and hydroxyl functionality have been found to provide the desired properties of high refractive index modulation, favorable adhesive characteristics, and relatively high clarity needed to prepare optical combiners embedded in windshields. Binders that are copolymers having the following constituents are selected in practicing the invention:

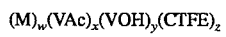

where M is a fluoromonomer; VAc is vinyl acetate; VOH is vinyl alcohol; and CTFE is a chlorofluoromonomer.

Perfluorinated fluoromonomers, especially tetrafluoroethylene and hexafluoropropylene, have been found to be particularly useful fluoromonomers (M) and are preferred. Other fluoromonomers, such as vinyl fluoride, vinylidene fluoride, fluoroolefins, fluorinated vinyl ether (such as 2,2, 2-trifluoroethyl vinyl ether), and fluoroalkyl acrylates and methacrylates (such as 2,2,2-trifluoroethyl acrylate), may be selected for specific applications. Combinations of two or more fluoromonomers may also be used.

The presence of fluorine in the binder generally reduces the refractive index of the polymer, thereby increasing the refractive index modulation values achieved after imaging and processing the hologram. For a fixed monomer/binder/photoinitiator composition, and for fixed exposure and processing conditions, the refractive index modulation increases with fluorine content. However, the fluorine content should be limited to that which does not cause the film to become opaque. Accordingly greater than 0%, approximately by weight, preferably 5 to 22% by weight, of copolymerized fluoromonomer (M) will be present in the binder. The binder will contain approximately 3 to 35% by weight fluorine, including fluorine present in the chlorofluoromonomer (CTFE) component.

Vinyl acetate (VAc) is present in approximately 40 to 90% by weight, preferably 50 to 75% by weight. However, copolymers made essentially from vinyl acetate and fluoromonomers have poor adhesion to glass, which limits their use in applications in which adhesion to glass is required, such as head-up displays.

Surprisingly, the refractive index modulation of the imaged hologram is improved by inclusion of a chlorofluoromonomer (CTFE) in the copolymeric binder in the amount of approximately 5 to 40%, preferably 15 to 30%, by weight. While chlorotrifluoroethylene is preferred, other chlorofluoromonomers, such as chloropentafluoropropylene, may be selected. Resulting binders have exhibited acceptable clarity with refractive index modulation values as high as 0.075 after imaging. It also has been found that these copolymers unexpectedly exhibit an increase in refractive index modulation values upon alcoholysis. This is unexpected since the vinyl alcohol present to improve adhesion would be expected to reduce the copolymer refractive index modulation.

The binders and photopolymerizable compositions described herein afford a balance of properties desired for the manufacture of optical combiners used in head-up displays. Namely, the binders provide a balance of relatively high refractive index modulation, good adhesive characteristics, and acceptable clarity. Provided that its presence does not unduly interfere with this balance, the binder also may contain other monomer units such as a vinyl ether (e.g., methyl, ethyl, propyl and butyl vinyl ether); an acrylate (e.g., methylacrylate); a methacrylate (e.g., methyl methacrylate); vinyl trimethylsilyl ether; and the like.

Accordingly, it has been found that the vinyl alcohol (VOH) component should be present in at least approximately 2% by weight to obtain desired adhesion, but no more than approximately 15% by weight to obtain useful refractive index modulation values. Preferred compositions will contain approximately 3 to 8% vinyl alcohol by weight.

As will be appreciated by those skilled in the art, the binders need not be prepared by polymerization of the monomers indicated in their structure. Listing of these monomers merely indicates the composition of the binders (as the number of copolymerized momomer repeat units in the binder), not the process by which they were prepared.

The binders of this invention may be prepared by the following process. Vinyl acetate is copolymerized with a fluoromonomer and a chlorofluoromonomer, or a mixture of fluoromonomers and chlorofluoromonomers, using conventional free-radical polymerization processes to produce a copolymer of vinyl acetate, chlorofluoromonomer, and fluoromonomer. Polymerization processes for polymerizing a fluoromonomer with vinyl acetate are disclosed, for example, in Trout, U.S. Pat. No. 4,963,471. If desired, additional monomers, such as vinyl ethers, may be copolymerized with the fluoromonomer, the chlorofluoromonomer, and vinyl acetate.

The vinyl acetate/fluoromonomer/chlorofluoromonomer copolymer is converted to a vinyl acetate/vinyl alcohol/ fluoromonomer/fluorochloromonomer copolymer by partial hydrolysis or partial alcoholysis in, for example, basic methanol. Well known methods for the production of polyvinyl alcohol from polyvinyl acetate can be used for this transformation.

Fluorinated/chlorinated binders provided by this invention, or mixtures thereof, can be selected for only a portion of the total binder if so desired. In this case, the other binder or binders must be compatible with the other components of the photosensitive composition to avoid undue sacrifice of film clarity, mechanical properties, etc.

MONOMERS

Photopolymerizable compositions contain at least one ethylenically unsaturated monomer that undergoes free-radical initiated polymerization to form a high molecular weight compound. Suitable monomers are well known in the art. In general, preferred monomers for photopolymer applications have boiling points greater than 100° C., more preferably greater than 150° C.

Monomers suited for use in photopolymerizable compositions adapted for recording holograms are disclosed in: Haugh, U.S. Pat. Nos. 3,658,526; Chandross, 3,993,485; Fielding, 4,535,041 and 4,588,664; Keys, 4,942,102; Monroe, 4,942,112; Smothers, 4,959,284; and Trout, 4,963,471, as well as in B. M. Monroe and W. K. Smothers, *Polymers for Lightwave and Integrated Optics: Technology and Applications, Part I: Foundations*, L. A. Hornak, Ed., Marcel Dekker, New York, 1992, pp. 145–170. In the preferred compositions, the monomer has one or more of the following moieties: (1) an aromatic moiety that is (i) substituted or unsubstituted phenyl, (ii) substituted or unsubstituted naphthyl, or (iii) substituted or unsubstituted heterocyclic aromatic moieties having up to three rings; (2) chlorine; (3) bromine, or mixtures thereof; and the binder is substantially free of said moiety or moieties except for chlorine present in the CTFE component in the binder.

Useful liquid monomers include, for example: 2-phenoxyethyl acrylate, 2-phenoxyethyl methacrylate, phenol ethoxylate monoacrylate, 2-(p-chlorophenoxy) ethyl acrylate, phenyl acrylate, 2-(1-naphthyloxy) ethyl acrylate, ethyl 1-benzoyl-2-vinyl-1-cyclopropane carboxylate, etc. Solid monomers, which may be used to advantage in combination with liquid monomers, include: N-vinylcarbazole; 2,4,6-tribromophenyl acrylate or methacrylate; pentachlorophenyl acrylate or methacrylate; 2-naphthyl acrylate or methacrylate.

If crosslinking of the photopolymer is desired, up to about five weight percent of at least one multifunctional monomer containing two or more terminal ethylenically unsaturated groups may be incorporated into the composition. The polyfunctional monomer must be compatible with the other components of the composition and preferably is a liquid. Representative polyfunctional monomers include the di-(2-acryloxyethyl)ether of bisphenol A, ethoxylated bisphenol A diacrylate.

INITIATOR SYSTEMS

The initiator system has one or more compounds that directly furnish free-radicals when activated by actinic radiation. By "actinic radiation" is meant radiation which is active to produce the free-radicals necessary to initiate polymerization of the monomer. The initiator system also can constitute a plurality of compounds, one of which yields the free-radicals after having been caused to do so by another compound (i.e., "sensitizer") that is activated by the radiation.

Conventional initiator systems, such as: photoreducible dyes and reducing agents, ketones, quinones, dye-borate complexes, and trichloromethyl triazines, can be used to initiate photopolymerization. Photoinitiators are discussed in: "Photopolymers: Radiation Curable Imaging Systems" by B. M. Monroe in *Radiation Curing: Science and Technology*, S. P. Pappas, Ed, Plenum, New York, 1992, pp. 399–440, and by K. K. Dietliker, in *Chemistry and Technology of UV and EB Formulation for Coatings, Inks, and Paints*, "Free-Radical Polymerization", P. K. T. Oldring, Ed, SITA Technology Ltd, London, Vol. 3, 1991, pp. 60–525.

Preferred initiator systems contain the 2,4,5-triphenylimidazolyl dimers disclosed in Chambers, U.S. Pat. Nos. 3,479, 185; Cescon, 3,784,557; Dessauer, 4,311,783; and Sheets, 4,622,286. Preferred 2,4,5-triphenylimidazolyl dimers are 2-Q-chlorosubstituted hexaphenylbisimidazoles in which the other positions on the phenyl radicals are unsubstituted or substituted with chloro, methyl or methoxy groups, such as: CDM-HABI, i.e., 2-(Q-chlorophenyl)-4,5-bis(m-methoxy-phenyl)-imidazole dimer; Q-Cl-HABI, i.e., biimidazole, 2,2'-bis (Q-chlorophenyl)-4,4',5,5'-tetraphenyl-; and TCTM-HABI, i.e., 1H-imidazole, 2,5-bis(Q-chlorophenyl)-4-[3,4-dimethoxyphenyl]-, each of which is typically used with a hydrogen donor.

Preferred sensitizers include those disclosed in: Baum and Henry, U.S. Pat. Nos. 3,652,275; Dueber, 4,162,162; Smothers, 4,917,977; and Monroe, 4,987,230. Particularly preferred sensitizers include: cyclopentanone, 2,5-bis[4-(diethylamino)phenyl]methylene]; cyclopentanone, 2,5-bis[(2, 3,6,7-tetrahydro-1H,5H-benzo[i, j ] quinolizin-9-yl)methylene]; cyclopentanone, 2,5-bis[2-(1,3-dihydro-1,3, 3-trimethyl-2H-indol-2-ylidene)ethnylidene]; and cyclopentanone, 2,5-bis-[2-ethylnaphtho[1,2-d]thiazol-2(1H)-ylidene)ethylidene]. Suitable hydrogen donors include: 2-mercaptobenzoxazole, 2-mercaptobenzothiazole, 4-methyl-4H-1,2,4,triazole-3-thiol, and the like. Other suitable hydrogen donors, which are preferred for compositions which contain N-vinylcarbazole, are 5-chloro-2-mercaptobenzothiazole; 2-mercaptobenzothiazole; 1H-1,2,4-triazole-3-thiol; 6-ethoxy-2-mercaptobenzothiazole; 4-methyl-4H-1, 2,4-triazole-3-thiol; 1-dodecanethiol; and mixtures thereof.

OTHER COMPONENTS

Other components conventionally added to photopolymerizable compositions can be present to modify the properties of the composition, provided they are compatible with the composition and do not adversely affect the properties of either the composition or the resulting hologram, such as optical clarity or adhesion to glass. Such components include: plasticizers, thermal stabilizers, optical brighteners, ultraviolet radiation absorbing material, adhesion modifiers, coating aids, pigments, dyes, and release agents.

COMPOSITION

The photopolymerizable compositions are dry films (i.e., dry to the touch). The binder is present in sufficient amount to form a film when the composition is coated. The photoinitiator system is present in sufficient amount to initiate polymerization of the monomer on exposure to actinic radiation. The monomer is present in sufficient amount to produce image differentiation on polymerization.

Proportions of ingredients in the photopolymerizable composition will generally be within the following percentage ranges, based on the total weight of the composition: binder 25 to 90%, preferably 45 to 75%; monomer(s), 5 to 60%, preferably, 15 to 50%; plasticizer, 0 to 25 %, preferably, 0 to 15 %; photoinitiator system, 0.1 to 10%, preferably 1 to 7%; and optional ingredients,0 to 5%, typically1 to 4%. If the amount of binder is below approximately 25 %, or the amount of monomer exceeds approximately 60%, the composition may not have sufficient viscosity to form a solid film. At high levels of binder addition, exceeding approximately 90%, performance is unduly lost, and the resulting films have diminished values of refractive index modulation. Likewise, levels of monomer(s) used will be at least approximately 5% since lower quantities will not produce films having practical values of refractive index modulation.

MANUFACTURE

The photopolymerizable compositions are used as a layer applied to a dimensionally stable support. The composition may be directly coated onto the support by any conventional method, or may be cast as a film and laminated to the support by conventional methods. In either case the support generally provides temporary dimensional stability for the photopolymerizable composition prior to mounting on a substrate, and thus the support is releasable from the composition. If the composition is to be irradiated through the support, the support must be transparent to actinic radiation. For some applications, however, it may be desired to retain the support as a permanent overcoat or protective layer for the composition, in which case the support and the composition may be permanently bonded. A preferred support material is polyethylene terephthalate film.

Typically a temporary release film, e.g., polyethylene, polypropylene, polyethylene terephthalate, etc, is laminated to the other side of the photopolymerizable composition to protect it during shipment and storage. Conventional intermediate layers or coatings may be used to facilitate the adhesive and/or release characteristics of the support and/or the temporary release film.

HOLOGRAPHIC EXPOSURE

A coherent light source (i.e., a laser) is used to holographically expose the photopolymerizable composition. Tunable lasers, which match the broad spectral sensitivity of these materials, may be used to advantage when the composition is sensitized across the visible spectrum.

Techniques for carrying out holographic exposures are well known to those skilled in the art. Early developments are described by E. N. Leith and J. Upatnieks, *Scientific American*, 212(6), 24–35 (Jun. 1965). A useful discussion of holography is presented in "Holography" by C. C. Guest in Encyclopedia of *Physical Science and Technology*, Vol. 6, pp. 507–519, R. A. Meyers, Ed., Academic Press, Orlando, Fla., 1987.

A diffraction grating can be characterized by its diffraction efficiency, that is the percent of incident radiation which is diffracted, and by its thickness. A holographic mirror can also be characterized by its diffraction (reflection) efficiency and by its thickness. A simple but useful theory for holographic gratings and mirrors, generally known as the "coupled wave theory", has been developed by H. Kogelnik, *Bell Syst. Tech. J.*, 48, 2909–2947, 1969. This theory treats the relationship between diffraction efficiency, hologram thickness, wavelength of incident radiation, and the angle of incident radiation. A useful discussion of this theory in regard to refractive index recording systems has been presented in Section II of W. J. Tomlinson and E. A. Chandross, Organic photochemical refractive-index image recording systems, *Adv. in Photochem.*, Vol. 12, J. N. Pitts, Jr., G. S. Hammond, and K. Gollnick, eds., Wiley-Interscience, New York, 1980, pp 201–281.

The coupled wave theory characterizes a hologram in terms of its refractive index modulation. This quantity is independent of hologram thickness and the wavelength and angle of incident radiation. Although the theory was developed for holographic gratings and mirrors, it can generally be used to describe the efficiency with which a hologram diffracts light.

Typically the temporary release film is removed, and the layer of photopolymerizable composition mounted on a substrate prior to exposure. The support may remain in place, acting as a coversheet, during exposure. The substrate must be transparent to actinic radiation. If the support remains in place during exposure, it must also be transparent to actinic radiation. Exemplary transparent substrates which may be selected to advantage include: glass, polyethylene terephthalate film, poly(methyl methacrylate), polycarbonate, and cellulose triacetate.

In the preparation of holograms from these photopolymerizable compositions, the hologram is fixed by a second, overall exposure to actinic radiation. The refractive index modulation of the hologram can be enhanced by heating to 100°–150° C. for about 0.5–2 hr following overall exposure, as described in Keys, U.S. Pat. No. 4,952,102.

Processes for altering the wavelength of response of holograms are described in Smothers, U.S. Pat. Nos. 4,959,283 and Gambogi, 5,182,180.

HEAD-UP DISPLAYS

A head-up display is an optical system that displays information on the windshield of a vehicle, such as the front windshield of an automobile or aircraft. The display simultaneously performs as an optical window (which transmits a nearly undistorted image) and as an analog of a conventional mirror or lens. Head up displays are described in Hartman, U.S. Pat. Nos. 4,613,200; Moss, 4,790,613; Wood, 4,842,389; Freeman, 4,998,784; and Keys, 4,950,567.

The optical combiner is a holographic mirror, or more complex holographic optics, constructed to efficiently reflect a selected, narrow bandwidth of light and transmit light of other wavelengths. The optical combiner is mounted in front of the operator, typically either in front of, on, or in the windshield. Using the selected wavelength, information is optically projected onto the combiner which reflects it into the operator's line of sight, superimposing the information on the operator's field of view. The operator can view the outside world through the combiner since the combiner reflects only a narrow band of radiation. Thus, the operator has immediate access to the information while continuing to view the path of the vehicle without the need to divert her or his attention to an instrument panel.

A head-up display typically has a light source, collimating optics, and an optical combiner. Referring to FIG. 1, windshield 40 has a first, inner glass ply 24, PVB layer 26, and second, outer glass ply 28. To form head-up display 38, optical combiner 10 is mounted in windshield 40 between inner ply 24 and PVB layer 26 in a position such that displayed information (i.e., vehicle speed, location gauge data, etc.) is readily available to viewer 42. The information to be displayed given on object 50 is projected from light source 44, which may be a cathode ray tube or a vacuum fluorescent display having a curved faceplate, etc., onto optical combiner 10. Optical combiner 10 reflects the information to viewer 42. Viewer 42 perceives the displayed information from object 50 as a virtual image 52, which appears as an image in front of the windshield. Other optical systems for projecting the information onto optical combiner 10 to produce head-up display 38 will be apparent to those skilled in the art. Likewise, details of other applications for combiner 10, such as mounting on a pivotal transparent screen or on the visor of a helmet, for aircraft applications, will be apparent to those skilled in the art.

To produce a head-up display a layer of the photopolymerizable composition is mounted on a transparent ply. In general, the layer will be mounted on the ply after it has been exposed and processed although, in some cases it may be desirable to coat or laminate the composition directly onto the ply and expose and process the composition on the ply. Alternatively, the composition may be exposed on the support, transferred to the ply, and processed. The exposed composition, processed or unprocessed, may be pressure laminated to the ply or may be attached with a transparent adhesive. If the unprocessed composition is laminated to the ply with heat, the lamination and thermal processing steps may be carried out at the same time.

After removal of the support, the hologram/ply assembly may be used as an optical combiner. For many applications, however, the assembly (after removal of the support) is placed in a lamination press along with a second ply with a sheet of polyvinyl butyral (e.g., Butacite® polyvinyl butyral resin sheeting) therebetween so that the hologram is in face to face contact with the polyvinyl butyral interleaf. Heat and pressure are applied (e.g., about 130° to 150° C.) whereby the reflection hologram is enhanced and fixed concurrently with forming a laminate consisting of first ply, hologram, polyvinyl butyral sheet, and second ply. A laminate is thereby formed that contains a holographic mirror substantially free of distortion. The laminate can be used as an optical combiner.

Alternatively, the second ply may be placed directly on the hologram so that a laminate is formed consisting of first ply, hologram, and second ply. Alternatively, instead of being laminated to the first ply, the hologram may be placed between sheets of polyvinyl butyral so a laminate is formed consisting of first ply, first polyvinyl butyral sheet, hologram, second polyvinyl butyral sheet, and second ply. Additional layers and coatings may be added as desired. In cases where holographic recording film (HRF) is in direct contact with PVB, plasticizers from the PVB layer may diffuse into the HRF, causing the HRF to swell resulting in a red shift at the playback wavelength of the hologram. This can be prevented by the use of a barrier layer film between the HRF and PVB layers.

Glass is typically used as the ply in such laminates, and is preferred. However, other transparent sheet materials, such as quartz, polymethyl methacrylate, polycarbonate, polystyrene, and the like, may also be used for other applications, provided that the thermal treatment conditions selected do not destroy the material.

Referring to FIG. 2, a preferred optical combiner comprises, in order: (A) a first adhesive layer 12; (B) a holographic recording composition 14 having a thickness of 5 to 20 microns; (C) a second adhesive layer 16; (D) a barrier layer 18 having a thickness of 1–10 microns; and (E) a third adhesive layer 20. The optical combiner typically has an overall thickness about 30 microns or less. The first, second, and third adhesive layers are independently selected from the group consisting of: (1) diisocyanates; (2) polyisocyanates; (3) blocked diisocyanates; (4) blocked polyisocyanates; (5) polyurethanes; (6) blocked isocyanate/polyurethane hybrids; (7) ultraviolet curable urethane acrylates; (8) blocked isocyanate/urethane acrylate hybrids; (9) blocked isocyanate/polyurethane/urethane acrylate hybrids; (10) epoxides; (11) blocked epoxides; (12) organosilanes; (13) acrylic, vinyl and nitrile elastomers; and (14) polyvinyl alcohol blends with an aqueous dispersion of said adhesive.

Glass is a preferred material for the inner and outer plies. Polyvinyl alcohol is a preferred barrier layer. Isocyanate-based adhesives, as described above, are useful and preferred for the first adhesive layer 12, the second adhesive layer 16, and the third adhesive layer 20. Aqueous dispersed polyurethane adhesives and ultraviolet curable urethane acrylate adhesives are preferred in particular. Blocked isocyanates are also preferred and may be used alone or in conjunction with other components such as preformed polyurethanes, urethane acrylates, etc.

The same adhesives that are useful and preferred in first adhesive layer 12 are also useful and preferred in second adhesive layer 16 and the third adhesive layer 20. In addition, polyvinyl alcohol blends containing many of these aqueous-based adhesives [blocked isocyanates such as Bayhydrol® 116 (Miles Inc.), polyurethanes such as Witcobond® W-213 (Witco Corp.), water-stable organosilanes such as Chemlok® 610 (Lord; Erie, Pa.), etc.] are particularly preferred for the third adhesive layer.

In preferred embodiments of optical combiner 10, the first, second, and third adhesive layers independently may be an isocyanate-based adhesive, a polyurethane adhesive, a urethane acrylate adhesive, or an organosilane adhesive. Furthermore, each of the three adhesive layers independently may be a blend of one or more of the adhesives with polyvinyl alcohol. In these preferred embodiments, the barrier layer is of polyvinyl alcohol. In these preferred embodiments, the optical combiner 10 is mounted in windshield 40 between inner ply 24 and PVB layer 26 with the first adhesive layer in contact with the inner glass ply 24 and the third adhesive layer in contact with PVB layer 26 in a position such that displayed information is readily available to a viewer.

INDUSTRIAL APPLICABILITY

While the invention has been described in detail with respect to optical combiners, it will be appreciated that the film compositions described herein may be used for a variety of applications that employ reflection holograms, described below, as well as other applications that rely on differences of refractive index, such as optical waveguides and microlens arrays. Accordingly, or vice versa, the term "refractive index imaging", or "refractive index images", as used herein encompasses all such applications in which the optical properties of the photopolymerizable film are selectively modified by a patterned exposure to actinic radiation.

Reflection holograms can be used as holographic optical elements, as in, for example, holographic notch filters, and in displays. A holographic notch filter rejects a selected narrow band of radiation and provides maximum transmission outside the selected band. Strong absorption of a narrow, selected portion of the spectrum allows protection from discrete laser lines yet allows for good visibility since the rest of the spectrum passes through the filter. Holographic notch filters provide protection against laser radiation for eyes and for sensors and other optical instruments in both military and non-military applications. Holographic notch filters are described, for example, in Keys, U.S. Pat. No. 4,965,152. Processes for altering the wavelength reflected by a reflection hologram are described in Smothers, U.S. Pat. No. 4,959,283.

Reflection holograms are suited for use in displays as, for example, in advertising or packaging; in security applications as, for example, on credit cards, bank notes, lottery tickets, and the like; and for information storage. Other specific uses for holograms prepared from the photosensitive elements of this invention will be evident to those skilled in the art.

The advantageous properties of this invention can be observed by reference to the following examples which illustrate, but do not limit, the invention.

| EXAMPLES GLOSSARY | |
|---|---|
| AIBN | 2,2'-Azobisisobutyronitrile; CAS 78-67-1 |
| o-Cl-HABI | Biimidazole, 2,2'-bis [o-chlorophenyl] 4,4',5,5'-tetraphenyl-; CAS 1707-68-2 |
| CTFE | Chlorotrifluoroethylene |
| HFP | Hexafluoropropylene |
| JAW | Cyclopentanone, 2,5-bis [(2,3,6,7-tetrahydro-1H,5H-benzo [i,j]-quinolizin-9-yl)methylene]; CAS 125594-50-5. |
| MMT | 4-Methyl-4H-1,2,4-triazole-3-thiol; CAS 24854-43-1 |
| NVC | N-Vinylcarbazole; 9-vinylcarbazole; CAS 1484-13-5 |
| Photomer® 4039 | Phenol ethoxylate monoacrylate; CAS 56641-05-5; Henkel Process Chemical Company, Ambler, PA |
| Sartomer® 349 | Ethoxylated bisphenol A diacrylate; CAS 24447-78-7; Sartomer Company, West Chester, PA |
| THF | Tetrahydrofuran |
| TFE | Tetrafluoroethylene |
| TMST | Trimethylsilyltriflate |
| Vazo® 52 | 2,2'-Azobis(2,4-dimethylpentanenitrile), CAS 4419-11-8, E. I. DuPont de Nemours, Wilmington, DE |
| Vinac® B-100 | Poly(vinyl acetate); M.W. 350,000; CAS 9003-20-7; Air Products, Allentown, PA |
| VAc | Vinyl acetate |
| VOH | Vinyl alcohol |
| VOS | Vinyl trimethylsilyl ether |

GENERAL PROCEDURES POLYMER SYNTHESIS AND CHARACTERIZATION

Fluorinated polymers were prepared as described in the examples. Inherent viscosities were measured on polymer solutions typically 0.20 weight % in THF at 30° C. (constant temperature bath) using a Cannon-Fenske viscometer. Polymer compositions were calculated from elemental analysis.

FILM PREPARATION

Coating solutions were prepared in amber bottles under red light. All components were added to the solvents, then rolled until completely dissolved. The coating solutions had 14 or 15 % total solids. It should be understood that "total solids" refers to the total amount of components which are not solvents, even though some of the components may be non-volatile liquids rather than solids at room temperature. All subsequent operations on coating solutions or resulting films were performed under red lights.

A Talboy coater equipped with a 152.4 micron doctor knife, 3.7 m drier set at 50°–70° C., and a laminator station was used to coat the solutions onto a 50.8 micron thick clear film support of polyethylene terephthalate (Mylar® polyester film). A coversheet of 23.4 micron thick Mylar® polyester film was laminated to the coatings as they emerged from the drier. Coated films were stored in black polyethylene bags at room temperature until used.

SAMPLE EVALUATION

The samples were routinely subjected to standard film speed exposures. Thus, the cover sheet was removed from a coated film, and the film was mounted by laminating the soft, tacky coating onto a clear glass plate, 10×13 cm. The remaining polyester support film was left in place during exposure and processing operations. The glass side was then coupled to a front surface mirror with a thin layer of xylene. This stack was mounted onto a computer-controlled, motorized stage. Holographic mirrors were recorded in the film by exposing with a collimated 514 nm argon-ion laser beam oriented perpendicular to the film surface so that the beam passed through the polyester film support, coating, glass plate, xylene layer and then reflected back onto itself by the mirror surface. The laser beam diameter was about 2 cm and its intensity was about 10 mW/cm$^2$. Sixteen mirrors were recorded in each film. Exposure times varied between 0.1 and 5 sec within each set of mirrors, corresponding to incident exposure energies of about 1 to 50 mW/cm$^2$.

After laser exposure, the plates were exposed to ultraviolet and visible light for 120 sec from a Theimer-Strahler #5027 mercury-arc photopolymer lamp (Exposure Systems Corp., Bridgeport, Conn.) mounted in a Douthitt DCOP-X exposure unit (Douthitt Corp., Detroit, Mich.) which delivered about 3 mW/cm$^2$ to the film plane. Finally the plates were thermally processed at 120° C. for 2 hrs in a forced-air convection oven.

The absorbance (optical density) spectra of each holographic mirror were recorded using a spectrophotometer (Perkin Elmer model Lambda-9). Peak optical density (OD) and wavelength were measured. Maximum reflection efficiency ($R_{max}$) was calculated from $R_{max}=1-10^{-OD}$. Finally, the bandwidths at 50% and 90% of peak reflection efficiency were measured. Plots of reflection efficiency versus total laser exposure were constructed to reveal the photospeed, which is defined as the minimum exposure required to attain the maximum reflection efficiency possible in the film. In all cases the photospeeds were less than 50 mJ/cm$^2$.

FILM THICKNESS AND HAZE MEASUREMENTS

Film thicknesses were measured by first laminating the film to glass, followed by UV cure (120 sec) and bake (15 min at 100° C.). The remaining polyester support film was then removed. A Sloan-Dektac Model 3030 profilometer was used to measure the coating thickness.

Film haze was measured as follows. Films were laminated to microscope slides in triplicate, then were subjected to UV exposure and placed in an oven at 100° C. for 7 days. A Gardner haze meter was then used to measure the % haze of each slide and results were averaged.

CALCULATION OF INDEX MODULATION

Kogelnik proposed the use of the coupled wave theory to describe performance of volume phase holograms. It is assumed that the refractive index modulates in a sinusoidal fashion about some average bulk index with constant frequency and amplitude. The application of Kogelnik theory to the analysis of holographic performance (i.e. peak playback wavelength, peak optical density and bandwidth) allows calculation of this index modulation ($\Delta n$).

EXAMPLES

PREPARATION OF TFE/CTFE/VAc TERPOLYMERS

Examples 1 through 4 describe preparations of TFE/CTFE/VAc terpolymers.

EXAMPLE 1

A 3.8 liter stirred stainless steel pressure vessel was charged with 1,360 g of methyl acetate, 650 g of vinyl acetate, 250 g of TFE and 175 g of CTFE. The reactor contents were equilibrated at 70° C. To start polymerization, 30 ml of a 0.30% solution of Vazo® 52 in methyl acetate were introduced into the reactor. This initiator solution was also fed continuously for 150 minutes at a rate of 0.5 ml per minute. After the initiator solution was shut off, reaction temperature was maintained at 70° C. for another 30 minutes. The reactor contents were cooled to 45 ° C., unpolymerized gaseous monomers were vented off and the polymer solution was discharged.

A total of 566 g of polymer was recovered. The inherent viscosity of this polymer, as well as of those made in other examples, was determined in tetrahydrofuran, at 30.0° C. and at a concentration of 0,200 g/100 ml. The composition of this polymer was calculated from analytical determination of wt.% C, H and Cl.

EXAMPLE 2

This example illustrates preparation of a TFE/CTFE/VAc terpolymer in a 38 liter stirred autoclave. The reactor was purged with nitrogen and charged with 9.0 Kg of methyl acetate, 4.5 Kg of t-butanol, 6.5 Kg of vinyl acetate, 2.5 Kg of TFE and 1.75 Kg of CTFE. After equilibrating at 70° C. the polymerization was started by quick addition of 150 ml of a 0.60% solution of Vazo® 52. This initiator solution was also fed continuously for 150 minutes at a rate of 1.25 ml per minute. After shutting off the initiator feed the reaction temperature was maintained at 70° C. for another 30 minutes. The polymer solution was cooled to 50° C. and 100 ml of a 0.50% solution of methyl ether of hydroquinone inhibitor were added. Unpolymerized gaseous monomers were vented off and the polymer solution was discharged. A total of 5.95 Kg of polymer was recovered.

EXAMPLE 3

Procedure of Ex. 2 was followed, except that the initial charge consisted of 6.5 Kg methyl acetate, 6.65 Kg t-butanol, 7.0 Kg of vinyl acetate, 2.5 Kg TFE and 1.75 kg CTFE. Total reaction time was 157 minutes during which 7.36 kg of polymer were made.

EXAMPLE 4

Into a 3.8 liter stainless steel pressure vessel, that had been purged with nitrogen, the following ingredients were charged: 660 g of t-butanol, 660 g of methyl acetate, 700 g of vinyl acetate, 160 g of TFE and 230 g of CTFE. The reactor contents were equilibrated at 70° C. and polymerization was started by addition of 30 ml of a 0.30% solution of Vazo® 52 in methyl acetate. This initiator solution was also added continuously for the next 2½ hours at a 25 ml/hr rate. Ninety minutes into the run 20 g of supplemental CTFE were added over a period of 30 minutes.

After the continuous initiator feed was shut off the reactor contents were maintained at 70° C. for an additional 45 minutes. The viscous polymer solution was cooled to 45 ° C., unreacted gaseous monomers were vented off and the product was discharged. After steam stripping and drying the terpolymer yield was 524 g.

PARTIAL ALCOHOLYSIS OF THE TFE/CTFE/VAC TERPOLYMERS

Examples 5 through 9 describe the alcoholyses of TFE/CTFE/VAc polymers forming TFE/CTFE/VAc/VOH polymers.

EXAMPLE 5

Fifty grams of the polymer film from Ex. 1 were dissolved in a 1 liter round bottom flask in 400 g of methanol and 100 g of acetone. The solution was brought to a reflux and the alcoholysis reaction was started by addition of 10 ml of a 1.00% solution of sodium methoxide in methanol. After one hour the reaction was stopped by addition of 3 g of glacial acetic acid. The polymer was precipitated in cold water, washed twice in distilled water and dried in a vacuum oven to a constant weight.

Composition of this tetrapolymer was determined from the absorption of the —OH band obtained from an infrared scan taken on a thin polymer film. The mole % of vinyl alcohol in the polymer was then read off from a previously constructed calibration curve.

EXAMPLE 6

The procedure of Ex. 5 was followed, except that terpolymer of Ex. 2 was alcoholized.

EXAMPLE 7

Again the same procedure was used, only with polymer from Ex. 3.

EXAMPLE 8

One hundred and fifty grams of polymer from Ex. 4 were dissolved in a 3 liter round bottom flask in 300 g of acetone and 1200 g of methanol. When the polymer had completely dissolved, and the solution was gently refluxing, the alcoholysis reaction was started by addition of 38 g of a 1.0% methanolic solution of sodium methoxide. After 45 minutes the reaction was stopped by addition of 4.5 g of glacial acetic acid. The polymer was recovered from solution and analyzed as described in Example 5.

EXAMPLE 9

This example illustrates preparation of a TFE/CTFE/VAc/VOH with a larger concentration of VOH.

Fifty grams of polymer from Example 4 were dissolved in a 1 liter round bottom flask in 100 g of acetone and 400 g of methanol. The alcoholysis reaction was started, at reflux, by addition of 25 mL of a 1.0% methanolic solution sodium methoxide. It was stopped after 45 minutes by addition of 3 g of glacial acetic acid. The polymer was recovered and analyzed as described in Example 5.

Preparation of a CTFE/VAC Copolymer

Example 10 illustrates the preparation of a CTFE/VAc copolymer.

EXAMPLE 10

The following ingredients were charged into a 3.8 liter pressure vessel that had been purged with nitrogen: 400 g of t-butanol, 200 g of methyl acetate, 1000 g of vinyl acetate and 450 g of CTFE. The reactor contents were warmed up to 70° C. and polymerization was started by addition of 30 ml of a 0.30% solution of Vazo® 52 in methyl acetate. The above solution was also added continuously for the next 2 hrs. at a 25 ml/hr. rate. During this 2 hr. period 50 g of CTFE were also added at a 25 g/hr. rate. The polymerization temperature was maintained at 70° C. by adjusting the temperature of cooling water being circulated through the reactor jacket. Thirty minutes after the feeds were shut off, the reactor contents were cooled to 45° C., unreacted CTFE was vented off and the polymer solution was discharged. The polymer yield was 663 g. Composition of this copolymer was calculated from its wt.% of Cl, H and C.

PARTIAL ALCOHOLYSIS OF THE CTFE/VAC TERPOLYMER

Example 11 illustrates the partial alcoholysis of a CTFE/VAc copolymer to form a CTFE/VAc/VOH terpolymer.

EXAMPLE 11

Fifty grams of the polymer from Example 10 were dissolved in a 1 liter round bottom flask in 1000 g of acetone and 400 g of methanol. When the polymer had completely dissolved, and the solution was gently refluxing, 30 g of a 1.0% methanolic solution of sodium methoxide were added. The solution was refluxed for one hour, at which point the alcoholysis was stopped by addition of 3 g of glacial acetic acid. The polymer was precipitated into cold tap water, washed with distilled water and dried to a constant weight in a vacuum oven at 120° C. Composition of this terpolymer was determined by the infrared technique as described in Example 5.

PARTIAL SILYLATION OF CTFE/VAC/VOH TERPOLYMER

Example 12 describes silylation of a CTFE/VAc/VOH terpolymer.

EXAMPLE 12

Fifteen grams of polymer from Example 11 were dissolved in 150 g of THF in a 500 ml round bottom flask. The solution was heated at reflux and 3.0 g of hexamethyldisilazane were added along with 8 drops (about 0.1 g.) of TMST catalyst. The solution was heated at reflux for one hour. The polymer was precipitated in cold tap water, washed once with distilled water and dried to constant weight under vacuum at approximately 120° C. The composition of this terpolymer was calculated from the intensity of the OH band obtained on infrared scan taken on a thin polymer film as described in Example 5.

PREPARATION OF A TFE/VAC COPOLYMER

Control A

This polymer was made by solution copolymerization of tetrafluoroethylene with vinyl acetate in a 38-liter stirred pressure reactor. The initial charge consisting of 12.0 kg. t-butanol, 2.5 kg. methyl acetate, 8.0 kg vinyl acetate and 1.80 kg tetrafluoroethylene was equilibrated at 65° C. Polymerization was started by injecting 140 ml. of a 4.8% solution of AIBN in methyl acetate. The polymerization temperature was maintained at 65° C. by supplying, as needed, cooling water to the reactor jacket. One hour into the run additional 150 g of tetrafluoroethylene were added over a period of 30 minutes. The polymerization was allowed to continue to a total of 140 minutes. At this time, the reactor contents were cooled to about 40° C. and some methyl ether of hydroquinone inhibitor, dissolved in acetone, was added to the reactor. After venting off unpolymerized tetrafluoroethylene the polymer solution was discharged. The recovered polymer weighed 5450 g It had an inherent viscosity of 1.60 dl/g. and its vinyl acetate content, determined by a quantitative hydrolysis procedure, was 77.6Wt. %.

PREPARATION OF TFE/VAC/VOH TERPOLYMER

Control B

Fifty grams of the TFE/VAc copolymer, Control A, were dissolved in a one liter round bottom flask in 500 ml. of acetone and 20 ml. of methanol. To start the alcoholysis 5.0 ml of a 2.00 Wt. % solution of sodium methoxide in methanol were added. The solution was allowed to reflux gently for 2 hours. During this time, the temperature of the polymer solution was 55.8° C. The alcoholysis reaction was stopped by a quick addition of 4 grams of glacial acetic acid. The polymer was recovered by precipitating it into cold water. The solid polymer was further purified by washing it twice more in distilled water. It was then dried under vacuum at around 100° C. to a constant weight. The composition of this polymer was determined by quantitative hydrolysis of remaining vinyl acetate groups.

HOLOGRAPHIC FILMS

Examples 13 through 26 demonstrate the effect of alcoholysis of TFE/CTFE/VAc and TFE/VAc based binders on the performance of holographic films. Example 24 demonstrates the effect of a silylated binder. Table I provides a summary of the composition of the binders. Table II summarizes the holographic performance of the respective films. Note that films are grouped in sets for comparison, one with precursor polymer as binder, the others with the partially alcoholized polymer as binder.

Note that film with TFE/VAc/VOH binders such as Ex. 16 give lower index modulation than the TFE/VAc precursors. In contrast films with TFE/CTFE/VAc/VOH binders give higher index modulation and lower haze than their TFE/CTFE/VAc precursors.

EXAMPLES 13 THROUGH 26

Film compositions for examples 13 through 15, and 17 through 19 were 63.7 wt % binder, as indicated in Table I, 21.0% Photomer® 4039, 8.0% NVC, 3.0% Sartomer 349, 3.0% o-Cl HABI, 1.0% MMT, 0.2% FC-430 and 0.1% JAW (components were coated from a 14 wt % solution in 85:15 methylene chloride:methanol).

Film compositions for examples 16, and 20 through 24 were 63.7 wt % binder, as indicated in Table I, 20.0% Photomer® 4039, 8.0% NVC, 3.0% Sartomer 349, 3.0% o-Cl HABI, 2.0% MMT, 0.2% FC-430 and 0.1% JAW (components were coated from a 14 wt % solution in 85:15 methylene chloride:methanol)

Film compositions for examples 25 and 26 were 63.7 wt % binder, as indicated in Table I, 22.0% Photomer® 4039, 8.0% NVC, 3.0% Sartomer 349, 2.0% o-Cl HABI, 1.0% MMT, 0.2% FC-430 and 0.1% JAW (components were coated from a 14 wt % solution in 85:15 methylene chloride:methanol).

TABLE I

Binders used in films, Examples 13–26

| Film Example | Binder Example | TFE | CTFE | VAc | VOH | VOS | Inherent Viscosity (dl/g) |
|---|---|---|---|---|---|---|---|
| 13 | 1 | 19.1 | 17.5 | 63.4 | — | — | 1.19 |
| 17 | 5 | 19.8 | 18.1 | 58.2 | 3.9 | — | 1.23 |
| 14 | 2 | 20.5 | 17.0 | 62.5 | — | — | 1.32 |
| 18 | 6 | 21.1 | 17.6 | 57.9 | 3.4 | — | 1.36 |
| 15 | 3 | 20.6 | 16.5 | 62.9 | — | — | 1.42 |
| 19 | 7 | 21.4 | 17.0 | 57.9 | 3.7 | — | 1.46 |
| 16 | 4 | 11.3 | 18.4 | 70.3 | — | — | 1.17 |
| 20 | 8 | 12.8 | 24.2 | 57.5 | 5.5 | — | 1.21 |
| 21 | 9 | 13.2 | 24.9 | 53.1 | 8.8 | — | 1.25 |
| 22 | 10 | — | 33.8 | 66.2 | — | — | 1.42 |
| 23 | 11 | — | 36.7 | 54.5 | 8.8 | — | 1.54 |
| 24 | 12 | — | 33.6 | 50.0 | 3.0 | 13.4 | 1.47 |
| 25 | Control A | 22.3 | — | 77.7 | — | — | 1.60 |
| 26 | Control B | 23.4 | — | 71.7 | 4.9 | — | 1.60 |

Note:
Component amounts of TFE, CTFE, VAc, VOH, and VOS are by weight percent.

TABLE II

Holographic properties, Examples 13–26

| Ex. | Binder | Thickness (μm) | $\lambda_{max}$ (nm) | OD[a] (nm) | FWHM[b] (nm) | BW90[c] (nm) | RIM[d] | Haze (%) |
|---|---|---|---|---|---|---|---|---|
| 13 | 1 | 9.8 | 503 | 2.02 | 28.0 | 18.0 | 0.053 | 10.4 |
| 17 | 5 | 10.0 | 504 | 2.82 | 30.0 | 26.0 | 0.074 | 1.06 |
| 14 | 2 | 10.3 | 504 | 2.12 | 25.0 | 18.0 | 0.053 | 6.27 |
| 18 | 6 | 9.9 | 504 | 2.76 | 30.0 | 25.5 | 0.073 | 1.08 |
| 15 | 3 | 10.7 | 504 | 2.87 | 24.0 | 20.5 | 0.058 | 4.02 |
| 19 | 7 | 10.0 | 501 | 3.02 | 28.0 | 24.0 | 0.069 | 0.69 |
| 16 | 4 | 12.9 | 503 | 2.15 | 27.3 | 21.4 | 0.063 | 0.87 |
| 20 | 8 | 10.3 | 493 | 3.42 | 26.7 | 23.3 | 0.068 | 1.40 |
| 21 | 9 | 10.3 | 494 | 2.46 | 25.7 | 22.4 | 0.066 | 1.41 |
| 22 | 10 | 10.4 | 504 | 2.30 | 24.6 | 21.2 | 0.061 | 0.86 |
| 23 | 11 | 10.2 | 505 | 2.16 | 21.8 | 17.8 | 0.052 | 0.60 |
| 24 | 12 | 8.8 | 504 | 2.65 | 27.0 | 23.4 | 0.067 | 1.32 |
| 25 | Control A | 10.4 | 505 | 2.24 | 24.0 | 21.0 | 0.062 | 0.78 |
| 26 | Control B | 11.1 | 503 | 2.71 | 22.8 | 18.7 | 0.054 | 0.72 |

[a]Optical Density at $\lambda_{max}$.
[b]Full width at half maximum reflectance (bandwidth).
[c]Full width at 90% maximum reflectance (bandwidth).
[d]Refractive index modulation.

What is claimed is:

1. In a photopolymerizable film composition containing a binder, a monomer, and a photoinitiator, for use in the preparation of refractive index images, the improvement wherein said binder is a copolymer comprising the formula:

$$(M)_w(VAc)_x(VOH)_y(CTFE)_z$$

wherein M is a fluoromonomer, VAc is vinyl acetate, VOH is vinyl alcohol and CTFE is a chlorofluoromonomer; w, x, y and z are weight percents and w is 5 to 22%, x is 50 to 75%, y is 3 to 8%, and z is 15 to 30%; with the proviso that said copolymer contains about 3 to 35% fluorine by weight; and wherein said film composition comprises by weight, 25 to 90% binder, 5 to 60% monomer, and 0.1 to 10% photoinitiator system.

2. The composition of claim 1 wherein said fluoromonomer M is selected from the group consisting of tetrafluoroethylene and hexafluoropropylene.

3. The composition of claim 1 or 2 wherein said chlorofluoromonomer CTFE is chlorotrifluoroethylene.

4. The composition of claim 1 imaged to contain a reflection hologram.

5. The composition of claim 4 laminated to a glass substrate.

6. A laminated structure comprising, in order:

(a) a first ply;

(b) a photopolymerizable film imaged to contain a refractive index image, said film comprising, by weight, 25 to 90% binder, 5 to 60% monomer, and 0.1 to 10% photoinitiator system, said binder comprising a copolymer having the formula $$(M)_w(VAc)_x(VOH)_y(CTFE)_z$$

wherein M is a fluoromonomer, VAc is vinyl acetate, VOH is vinyl alcohol, CTFE is a chlorofluoromonomer; w, x, y, and z are weight percents and w is 5 to 22%, x is 50 to 75%, y is 3 to 8%, and z is 15 to 30%; with the proviso that said copolymer contains about 3 to 35% fluorine by weight;

(c) and a second ply.

7. The laminate of claim 6 wherein said first and second plies are glass.

8. The laminate of claim 6 or 7 wherein a polyvinyl butyral sheet is between said imaged photopolymerizable film and said second ply.

9. The laminate of claim 6 wherein said fluoromonomer M is selected from the group consisting of tetrafluoroethylene and hexafluoropropylene, and said chlorofluoromonomer CTFE is chlorotrifluoroethylene.

10. The laminate of claim 9 wherein said first and second plies are glass and wherein a polyvinyl butyral sheet is between said imaged photopolymerizable film and said second ply.

11. The laminate of claim 10 wherein a barrier layer is between said imaged photopolymerizable film and said polyvinyl butyral sheet.

12. The laminate of claim 11 wherein said barrier layer is a polyvinyl alcohol film.

13. The laminate of claim 6 wherein the refractive index image is a reflection hologram.

* * * * *